United States Patent [19]

Honda et al.

[11] Patent Number: 5,579,208
[45] Date of Patent: Nov. 26, 1996

[54] SEMICONDUCTOR DEVICE HAVING A PLURALITY OF SEMICONDUCTOR CHIPS

[75] Inventors: Tosiyuki Honda, Kawasaki; Takao Haranosono, Satsuma-gun, both of Japan

[73] Assignees: Fujitsu Limited, Kawasaki; Kyushu Fujitsu Electronics Limited, Satsuma, both of Japan

[21] Appl. No.: 459,689

[22] Filed: Jun. 2, 1995

Related U.S. Application Data

[62] Division of Ser. No. 214,318, Mar. 17, 1994, Pat. No. 5,471,369.

[30] Foreign Application Priority Data

Jul. 9, 1993 [JP] Japan ................... 5-170540

[51] Int. Cl.$^6$ .............................. H05K 5/02; H01L 23/28
[52] U.S. Cl. .................. 361/813; 174/52.2; 257/778; 257/787; 257/686; 361/735
[58] Field of Search .................. 361/728–730, 361/735, 813; 174/52.2; 257/777–778, 787–788, 791–794, 685–686; 437/208, 211–213, 219–220

[56] References Cited

FOREIGN PATENT DOCUMENTS 56-062351  5/1981  Japan .
1-303730  12/1989  Japan .
2-156662  6/1990  Japan .
4-184949  7/1992  Japan .

*Primary Examiner*—Bot L. Ledynh
*Attorney, Agent, or Firm*—Staas & Halsey

[57] ABSTRACT

A chip-on chip type semiconductor device is provided in which semiconductor chips provided in a package cannot be displaced during a transfer molding process so as to eliminate a short circuit. At least two lead frames are provided in and extend from the package so that the first semiconductor chip and the second semiconductor chip can be electrically connected to external devices. A die stage is provided between the first semiconductor chip and the second semiconductor chip. A bonding wire is provided for wiring between the first semiconductor chip and the lead frames, and TAB leads connect the second semiconductor chip to the lead frames. The lead frames may extend between the first and second semiconductor devices instead of the die stage. The lead frames may include one having a portion extending in a direction perpendicular to the longitudinal direction of the lead frames between the first and second semiconductor chips.

7 Claims, 16 Drawing Sheets

5,579,208

SEMICONDUCTOR DEVICE HAVING A PLURALITY OF SEMICONDUCTOR CHIPS

This application is a division of application Ser. No. 08/214,313, filed Mar. 17, 1994, now U.S. Pat. No. 5,471, 360.

BACKGROUND OF THE INVENTION

1. Field of the Invention

The present invention generally relates to semiconductor devices, and more particularly to a semiconductor device having a plurality of semiconductor chips within a package thereof.

2. Description of the Prior Art

Recently, a highly integrated chip-on-chip type semiconductor device which has a plurality of semiconductor chips provided in a single package has been used so as to satisfy the requirement of downsizing for electronic equipments. In order to reduce a semiconductor chip in its weight and size, it is required to have a thinner package.

FIG. 1 is a cross sectional view of an example of a conventional chip-on-chip type semiconductor device. A conventional semiconductor device 11 comprises semiconductor chip 14a mounted on an upper surface of a die stage 12 with an adhesive 13a. A semiconductor chip 14b is mounted on a bottom surface of the die stage 12 with an adhesive 13b. The semiconductor chip 14b is mounted upside down relative to the semiconductor chip 14a. The semiconductor chip 14a is electrically connected to lead frames 16a and 16b by bonding wires 15a and 15b, respectively, so that the semiconductor chip 14a can be electrically connected to external devices. Similarly, the semiconductor chip 14b is electrically connected to lead frames 16a and bonding wires 15c and 15d, respectively, so that the semiconductor chip 14b can be electrically connected to external devices.

FIG. 2 is a cross sectional view of another example of a conventional chip-on-chip type semiconductor device. As shown in FIG. 2, a conventional semiconductor device 1 comprises two semiconductor chips 3a and 3b. The semiconductor chips 3a and 3b are positioned in a center opening section of a lead frame 2. The surfaces of semiconductor chips 3a and 3b, which are provided with circuitry, are directed upward. The semiconductor chip 3a is attached to an end of each of TAB (Tape Automated Bonding) leads 5a and 5b which are bent as shown in FIG. 2, by means of inner lead bonding. The semiconductor chip 3b is connected to an end of each of TAB leads 5c and 5d by means of inner lead bonding. The TAB leads 5a and 5b are bent so that a predetermined space is formed between the bottom surface 3a" of the semiconductor chip 3a and the top surface 3b' of the semiconductor chip 3b.

The other end of each of the TAB leads 5a, 5b, 5c and 5d is connected to the respective outer lead 6 of the lead frame 2 by means of outer lead bonding. The semiconductor chips 3a and 3b are packaged using molding resin 7 by means of transfer molding. The outer lead 6 is bent, for example, in an L or J shape so that the packaged semiconductor device 1 can be surface mounted on a circuit board (not shown in the figure).

FIGS. 3A and 3B are views showing another example of a conventional chip-on-chip type semiconductor device; FIG. 3A is a cross sectional view taken along a line X—X' of FIG. 3B; FIG. 3B is a plan view.

A semiconductor device 21 shown in FIG. 3A comprises semiconductor chips 22a and 22b connected to the respective TAB leads 23a, 23b, and 23c, 23d by means of inner lead bonding. The semiconductor chip 22a is supported by TAB leads 23a and 23b, and the semiconductor chip 22b is supported by TAB leads 23c and 23d. The semiconductor chip 22a is connected to lead frames 24a and 24b via the TAB leads 23a and 23b, respectively, and the semiconductor chip 22b is connected to lead frames 24a and 24b via the TAB leads 23c and 23d, respectively. The semiconductor chip 22a is positioned upside down relative to the semiconductor chip 22b. Accordingly, the semiconductor chips 22a and 22b can be electrically connected to external devices. It should be noted that each of TAB leads 23a, 23b, 23c and 23d is bent as shown in FIG. 3A so that a space is formed between the semiconductor chip 22a and the semiconductor chip 22b.

FIG. 4 is a cross sectional view of another example of a conventional chip-on-chip type semiconductor device. A semiconductor device 31 shown in FIG. 4 comprises two semiconductor chips 32a and 32b, the semiconductor chip 32a being upside down relative to the semiconductor chip 32a. The semiconductor chip 32a is supported by TAB leads 33a and 33b, and the semiconductor chip 32b is supported by TAB leads 33c and 33d. The semiconductor chips 32a and 32b are connected to a lead frame 34a via the respective TAB leads 33a and 33c, and connected to a lead frame 34b via the respective TAB leads 33b and 33d. Accordingly, the semiconductor chips 32a and 32b can be electrically connected to external devices via the lead frames 34a and 34b. It should be noted that each of the TAB leads 33a, 33b, 33c and 33d is straight as shown in FIG. 4

In the above-mentioned conventional semiconductor devices, there are problems described below.

In a manufacturing process of the semiconductor device 11 shown in FIG. 1, the semiconductor chip 14a is attached first to the die stage 12. After that, the die stage 12 is reversed so that the semiconductor chip 14a is positioned underneath the die stage 12 in order to mount the semiconductor chip 14b on the reverse surface of the die stage 12. When mounting the semiconductor chip 14b, the semiconductor chip 14b is required to be pressed by a die via the surface of the semiconductor chip 14b as shown in FIG. 5.

In order to prevent the die stage from moving when the semiconductor chip 14b is pressed, the die stage 12 is fixed to a die table 18, and the semiconductor chip 14a is supported by the die table 18. There is a problem in that the surface of the semiconductor chip 14a may be damaged when the semiconductor chip 14a makes contact with the surface of the die table 18.

Additionally, if the semiconductor chip 14b is mounted on the die stage 12 after the semiconductor chip 14a is wire bonded, there may be a problem in that a bonding wire is bent or deformed by the reason the same as above.

In the case of the semiconductor device 1 of FIG. 2 and the semiconductor device 21 of FIG. 3A and 3B, two semiconductor chips are attached to the TAB leads on either side. Accordingly, semiconductor chips are supported only by the TAB leads before they are packaged, and thus the semiconductor chips tend to be displaced when a transfer molding process is applied.

A description will now be given, with reference to FIGS. 6A and 6B, of the transfer molding process of the semiconductor device 1 as an example.

As shown in FIG. 6A, the lead frame 2 and the semiconductor chips 3a and 3b are placed inside a cavity 9 formed between an upper mold 8a and a lower mold 8b after the semiconductor chips 3a and 3b are attached to the lead frame 2 via the respective TAB leads 5a, 5b, 5c and 5d. The transfer molding is performed by injecting an amount of melted molding resin into the cavity 9 via a gate 10. At the initial stage of injection, as shown in FIG. 6A, little force is applied to the semiconductor chips 3a and 3b, and thus the semiconductor chips 3a and 3b stay in the respective predetermined supported positions.

However, as the molding resin progresses to the far end of the semiconductor chips 3a and 3b from the gate 10, forces in various directions are applied to the semiconductor chips 3a and 3b due to the flow of the viscous molding resin. Since the semiconductor chip 3a is supported only by the TAB leads 5a and 5b which are made of thin films having a low rigidity and since they are bent, as shown in the figure, the TAB leads may be deformed by the forces applied to the semiconductor chip 3a by the resin flow. The TAB leads 5a and 5b are formed of, for example, a polyimide film having a thickness of 125 µm with a copper pattern film having a thickness of 35 µm adhering thereto. Accordingly, the semiconductor chip 3a may be displaced and the TAB leads 5a and 5b may be deformed, due to the flow of the molding resin.

Although the semiconductor chip 3b is supported by the TAB leads 5c and 5d which are not bent like TAB leads 5a and 5b, the semiconductor chip 3b may be displaced slightly because the TAB leads 5c and 5d are formed of the same materials having a low rigidity as that of the TAB leads 5a and 5b.

In order to eliminate the above-mentioned problem caused by the flow of the molding resin, various molding methods are suggested in which the viscosity of the molding resin is changed or the position of the gate 10 is changed so that the flow of the molding resin does not affect the position of the semiconductor chips 3a and 3b. However, even if the injection conditions are appropriately controlled, the semiconductor chips 3a and 3b may be displaced due to variability of manufacturing accuracy of the TAB leads.

If the semiconductor chips 3a and 3b are displaced and the TAB leads are accordingly deformed, the TAB lead 5d may be in contact with the surface 3a' of the semiconductor chip 3a or the TAB lead 5a may be in contact with an upper edge of the semiconductor chip 3a, which conditions result in a short circuit in the semiconductor device. This is a problem common as well to the semiconductor devices 21 and 31 of the preceding FIGS. 3A to 4.

Additionally, there are two other problems in the semiconductor device 21 shown in FIG. 3A. One problem is, as described below, that one of the semiconductor chips 22a and 22b must be mirror symmetric to the other one. The other problem is, as described below, that the wiring to a chip selector pad is complex when the semiconductor chips are wired so that each of the semiconductor chips performs a different operation.

As shown in FIG. 3A, the TAB lead 23b connected to the pad 25a of the semiconductor chip 22a and the TAB lead 23d connected to the pad 25b of the semiconductor chip 22b are both connected to the same lead frame 24b. Accordingly, the pad 25a of the semiconductor chip 22a and the pad 25b of the semiconductor chip 22b must be pads having the same electrical function. Therefore, the semiconductor chips 22a and 22b must be mirror symmetric to each other with respect to the pads provided on the surfaces of the semiconductor chips 22a and 22b. Due to the above, it is difficult to provide the same two semiconductor chips, that is semiconductor chips having the same pad construction, in a single package.

Additionally, in the existing semiconductor chip technology, independent voltage signals are individually supplied to the semiconductor chips 22a and 22b so that the semiconductor chips 22a and 22b perform different operations. Therefore, as shown in a semiconductor device 21a of FIGS. 7A and 7B, a TAB lead 30 must be extended as indicated by dashed lines in the figures. FIG. 7A is a cross sectional view of the semiconductor device 21a taken along a line 7A—7A in FIG. 7B; FIG. 7B is a plan view of a portion of the semiconductor device 21a. The TAB lead 30 is extended from a pad 27 to a lead frame 29 which not is located in the position nearest to the pad 27 while TAB lead 23a is connected to the lead frame 28 in a position nearest to the pad 26. If the lead frames 28 and 29 are located adjacent to each other, the TAB lead 30 can be extended to the lead frame 29. However, if the lead frame 29 is provided in a position distant from the lead frame 28, it is difficult to extend the TAB lead 30 to the distant lead frame 29. That is, there is a problem, in such a case, that the wiring to the chip select pad cannot be performed.

SUMMARY OF THE INVENTION

It is a general object of the present invention to provide a semiconductor device in which the above-mentioned disadvantages are eliminated.

A more specific object of the present invention is to provide a semiconductor device in which semiconductor chips provided in a package cannot be displaced during a transfer molding process thereby to eliminate a short circuit due to contact of the semiconductor chips with a bonding wire or a TAB lead connecting the semiconductor chips to a lead frame.

Another object of the present invention is to provide a semiconductor device having at least one pair of semiconductor chips therein, in which semiconductor device identical semiconductor chips can be used as the semiconductor chips of the pair.

Another object of the present invention is to provide a semiconductor device in which a lead frame connected to a predetermined pad provided on a semiconductor chip can be extended from a desired position of a package.

In order to achieve the above-mentioned objects, there is provided, according to the present invention, a semiconductor device comprising:

a package having at least a first semiconductor chip and a second semiconductor chip, the first semiconductor chip being positioned above the second semiconductor chip;

at least two lead frames provided in and extending from the package so that the first semiconductor chip and the second semiconductor chip can be electrically connected to external devices;

a die stage provided between the first semiconductor chip and the second semiconductor chip;

a bonding wire provided for wiring between the first semiconductor chip and the lead frames; and TAB leads connecting the second semiconductor chip to the lead frames.

There is further provided, according to the present invention, a semiconductor device comprising:

a package having at least a first semiconductor chip and a second semiconductor chip, the first semiconductor chip being positioned above the second semiconductor chip;

at least two lead frames provided in and extending from the package so that the first semiconductor chip and the second semiconductor chip can be electrically connected to external devices;

a die stage provided between the first semiconductor chip and the second semiconductor chip;

at least one first TAB lead connecting the first semiconductor chip to a corresponding one of the lead frames; and at least one second TAB lead connecting the second semiconductor chip to a corresponding one of the lead frames.

There is yet further provided, according to the present invention, a semiconductor device comprising:

a package having at least a first semiconductor chip and a second semiconductor chip, the first semiconductor chip being positioned above the second semiconductor chip;

at least a first lead frame and a second lead frame provided between the first and second semiconductor chips and extending from the package so that the first semiconductor chip and the second semiconductor chip can be electrically connected to external devices, the first lead frame extending from a first side of the first and second semiconductor chips to a second side, opposite to the first side of the first and second semiconductor chips, the second lead frame extending from the second side to the first side;

at least one first connecting member provided for connecting the first semiconductor chip to the first and second lead frames; and at least one second connecting member provided for connecting the second semiconductor chip to the first and second lead frames.

There is still further provided, according to the present invention, a semiconductor device comprising:

a package having at least a first semiconductor chip and a second semiconductor chip, the first semiconductor chip being positioned above the second semiconductor chip;

at least a first lead frame, a second lead frame and a third lead frame provided between the first and second semiconductor chips and extending from the package so that the first semiconductor chip and the second semiconductor chip can be electrically connected to external devices, the first lead frame extending a predetermined length from a first side of the first and second semiconductor chips, the second lead frame extending from a second side, opposite to the first side, of the first and second semiconductor chips, a space being formed between an end of the first lead frame and an end of the second lead frame and between the first semiconductor chip and the second semiconductor chip, the third lead frame having a portion extending, in the space, in a direction perpendicular to the longitudinal direction of the first and second lead frames;

at least one first TAB lead connecting the first semiconductor chip to a corresponding one of the first and third lead frames; and at least one second TAB lead connecting the second semiconductor chip to a corresponding one of the second and third lead frames.

Other objects, features and advantages of the present invention will become more apparent by the following detailed description when read in conjunction with the accompanying drawings.

BRIEF DESCRIPTION OF THE DRAWINGS

FIGS. 3A and 3B are views showing another example of a conventional chip-on-chip type semiconductor device, in which FIG. 3A is a cross sectional view taken along a line 3A—3A in FIG. 3B and FIG. 3B is a plan view of a part of the semiconductor device shown in FIG. 3A;

FIG. 7A and 7B are views showing another example of a conventional chip-on-chip type semiconductor device, in which FIG. 7A is a cross sectional view taken along a line 7A—7A in FIG. 7B and FIG. 7B is a plan view of a part of the semiconductor device shown in FIG. 7A;

FIGS. 12A and 12B are views showing another variation of the first embodiment shown in FIG. 8, in which FIG. 12A is a cross sectional view taken along a line 12A—12A in FIG. 12B and FIG. 12B is a plan view of a part of the semiconductor device shown in FIG. 12A;

FIGS. 15A and 15B are views showing a second embodiment of a semiconductor device according to the present invention in which FIG. 15A is a cross sectional view taken along a line 15A—15A in FIG. 15B and FIG. 15B is a plan view of a part of the semiconductor device shown in FIG. 15A;

FIGS. 17A and 17B are views showing another variation of the second embodiment shown in FIG. 15A, in which FIG. 17A is a cross sectional view taken along a line 17A—17A in FIG. 17B and FIG. 17B is a plan view of a part of the semiconductor device shown in FIG. 17A;

FIGS. 18A and 18B are views showing another variation of the second embodiment shown in FIG. 15A in which FIG. 18A is a cross sectional view taken along a line 18A—18A in FIG. 18B and FIG. 18B is a plan view of a part of the semiconductor device shown in FIG. 18A;

FIGS. 19A and 19B are views showing a third embodiment of a semiconductor device according to the present invention in which FIG. 19A is a cross sectional view taken along a line 19A—19A in FIG. 19B and FIG. 19B is a plan view of a part of the semiconductor device shown in FIG. 19A;

22A is a cross sectional view taken along a line 22A—22A in FIG. 22B and FIG. 22B is a plan view of a part of the semiconductor device shown in FIG. 22A;

FIGS. 23A and 23B are views showing a fourth embodiment of a semiconductor device according to the present invention in which FIG. 23A is a cross sectional view taken along a line 23A—23A in FIG. 23B and FIG. 23B is a plan view of a part of the semiconductor device shown in FIG. 23A; and FIGS. 24A and 24B are views showing a variation of the fourth embodiment shown in FIG. 23A in which FIG. 24A is a cross sectional view taken along a line 24A—24A in FIG. 24B and FIG. 24B is a plan view of a part of the semiconductor device shown in FIG. 24A.

DETAILED DESCRIPTION OF THE PREFERRED EMBODIMENTS

Figure 1:
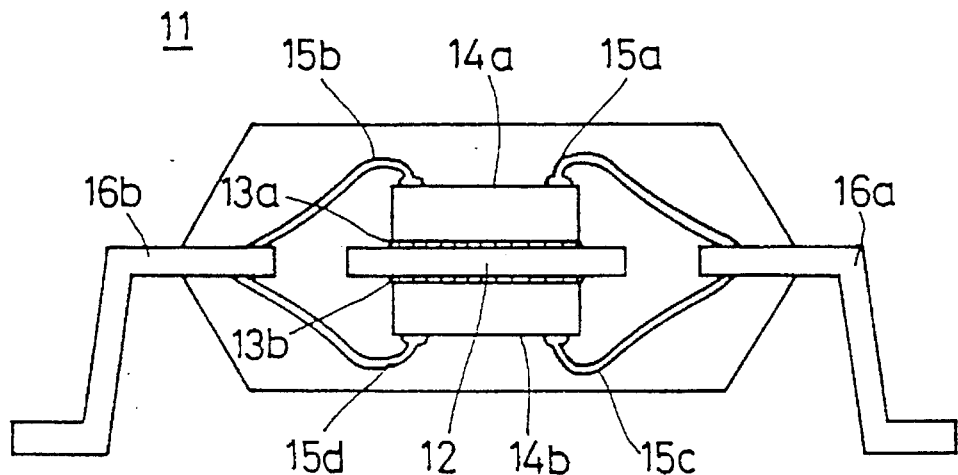
FIG. 1 is a cross sectional view of an example of a conventional chip-on-chip type semiconductor device.
Figure 2:
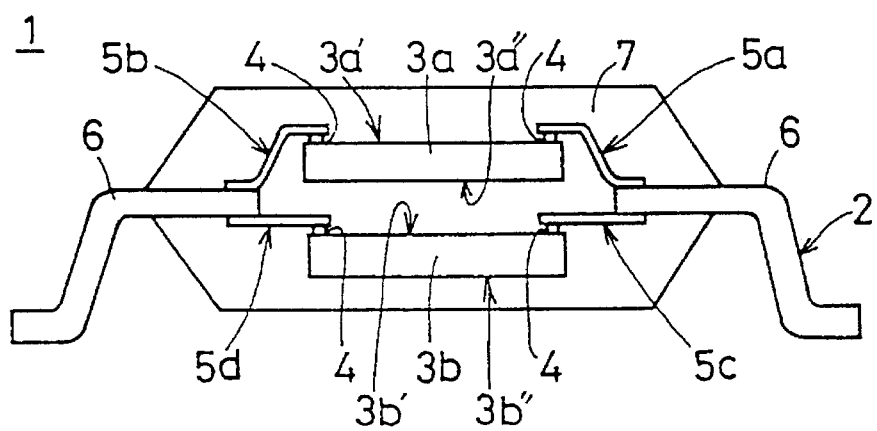
FIG. 2 is a cross sectional view of another example of a conventional chip-on-chip type semiconductor device.
Figure 3A:
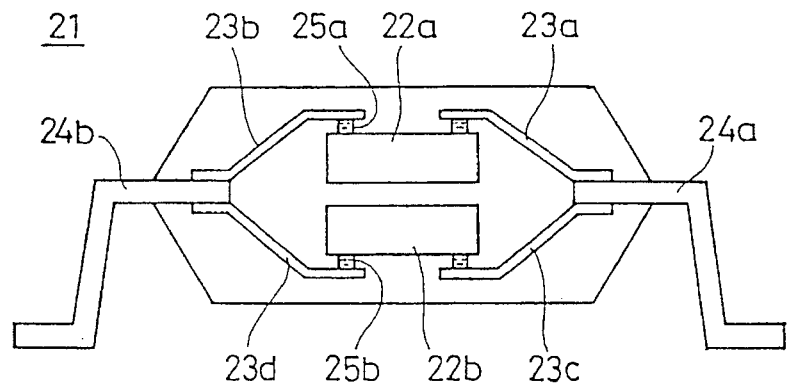
Figure 3B:
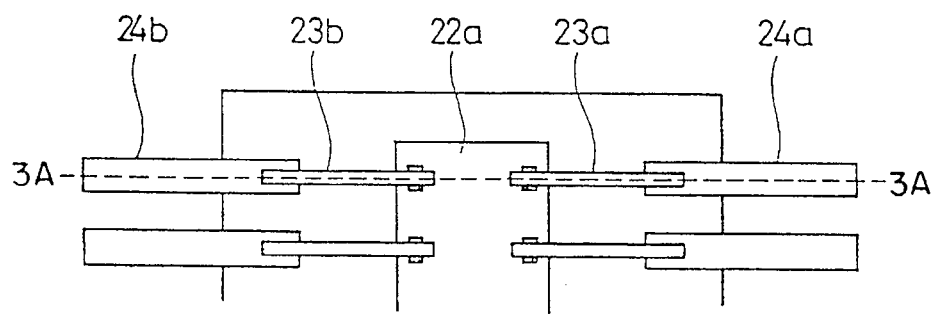
Figure 4:
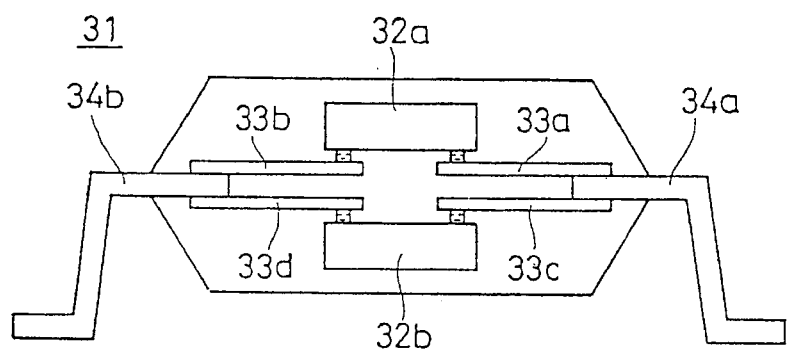
FIG. 4 is a cross sectional view of another example of a conventional chip-on-chip type semiconductor device.
Figure 5:
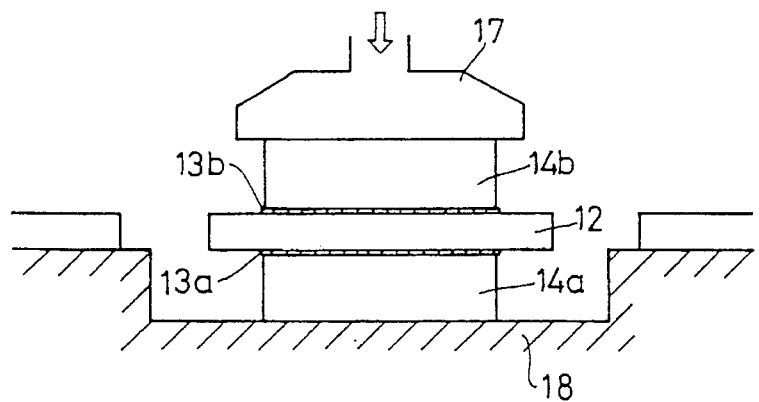
FIG. 5 is a view showing a manufacturing process of the semiconductor device shown in FIG. 1.
Figure 6A:
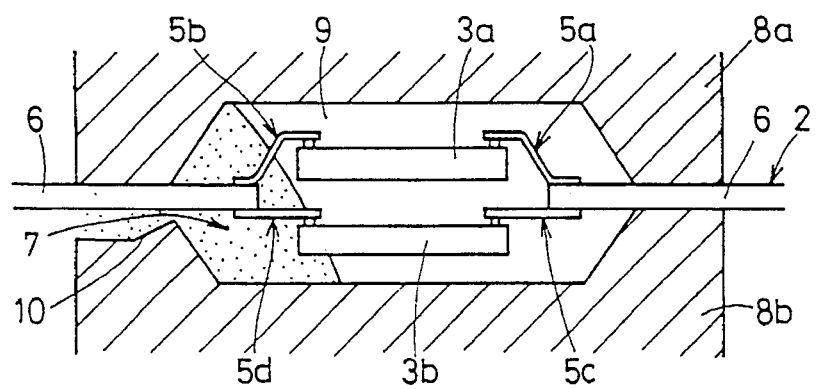
FIGS. 6A and 6B are views showing a transfer molding process of the semiconductor device shown in FIG. 2.
Figure 6B:
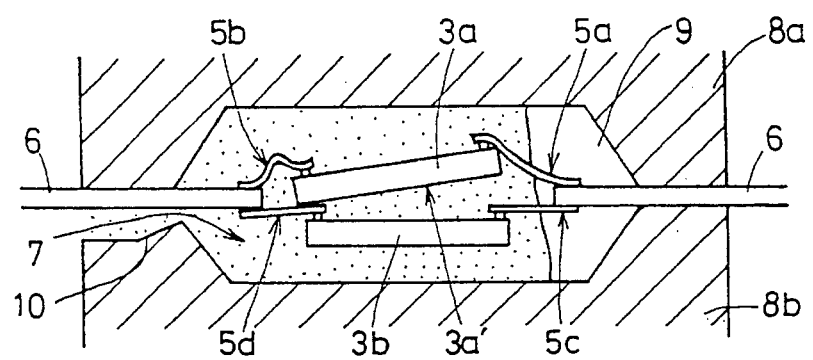
Figure 7A:
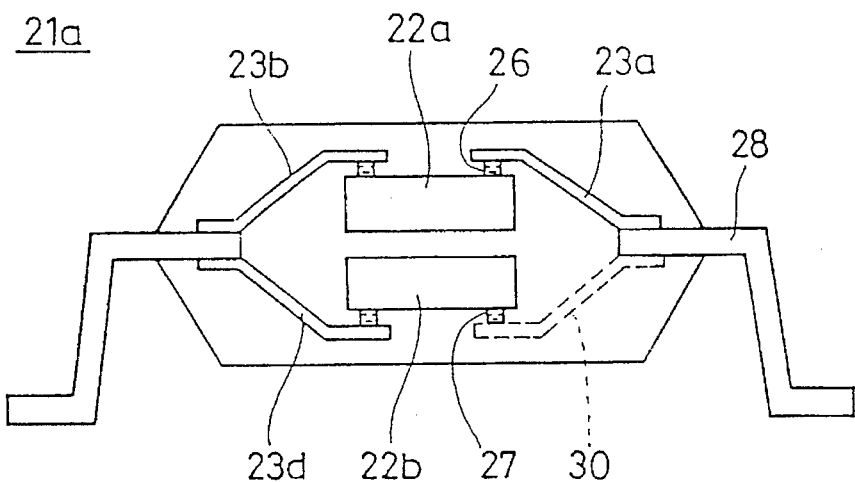
Figure 7B:
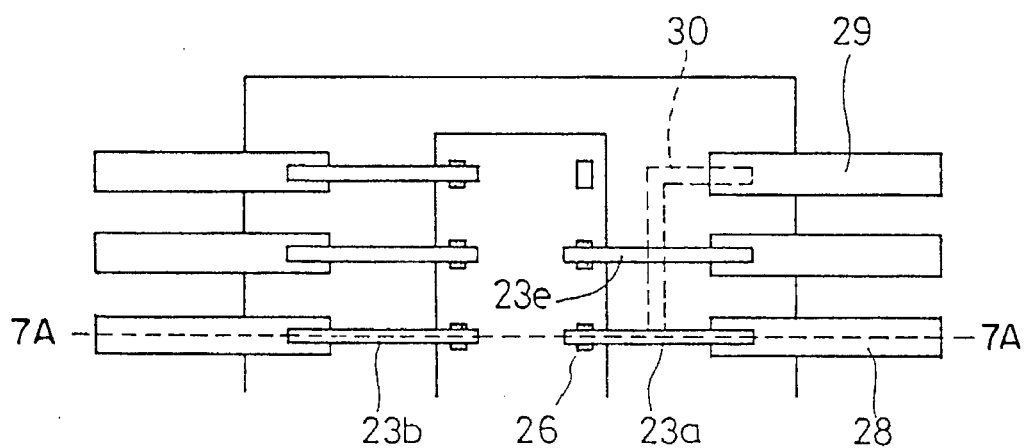
Figure 8:
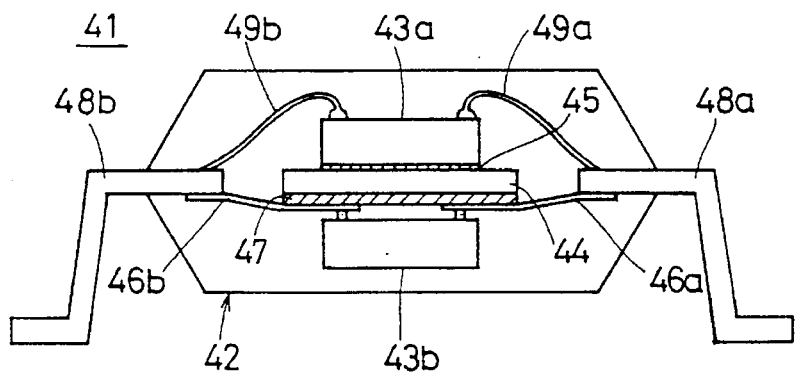
FIG. 8 is a cross sectional view of a first embodiment of a semiconductor device according to the present invention.

A description will now be given, with reference to FIG. 8, of a first embodiment of a semiconductor device according to the present invention. FIG. 8 is a cross sectional view of the first embodiment of a semiconductor device according to the present invention.

The semiconductor device 41 of the first embodiment according to the present invention comprises two semiconductor chips 43a and 43b within a single package 42. The semiconductor chip 43a is mounted on an upper surface of a die stage 44 with an adhesive 45. The surface on which circuitry is provided is directed upwardly. The semiconductor chip 43b is positioned underneath the die stage 44 with its surface on which circuitry is provided directed upwardly. An insulating member 47 is placed between the semiconductor chip 43b and the die stage 44.

The semiconductor chip 43a is electrically connected to lead frames 48a and 48b via bonding wires 49a and 49b, respectively, so that the semiconductor chip 43a can be electrically connected to external devices. The semiconductor chip 43b is electrically connected to lead frames 48a and 48b via TAB leads 46a and 46b, respectively, so that the semiconductor chip 43b can be electrically connected to external devices.

A description will now be given, with reference to FIG. 9, of a manufacturing process of the semiconductor device 41.

The insulating member 47 is first attached to the die stage 44. The die stage 44 is then placed on a die table 50 with the insulating member 47 being positioned between the die table 50 and the die stage 44. After that, the semiconductor chip 43a is mounted on the die stage 44 with an adhesive 45, and then the semiconductor chip 43a is connected to the lead frames 48a and 48b by the bonding wires 49a and 49b, respectively, by means of wire bonding.

On the other hand, the semiconductor chip 43b is attached to a TAB tape 51 by means of inner lead bonding. Unnecessary parts of the TAB tape 51 are then cut off at positions indicated by dotted lines in the figure, and thereby the semiconductor chip 43b provided with the TAB leads 46a and 46b is prepared.

Figure 9:
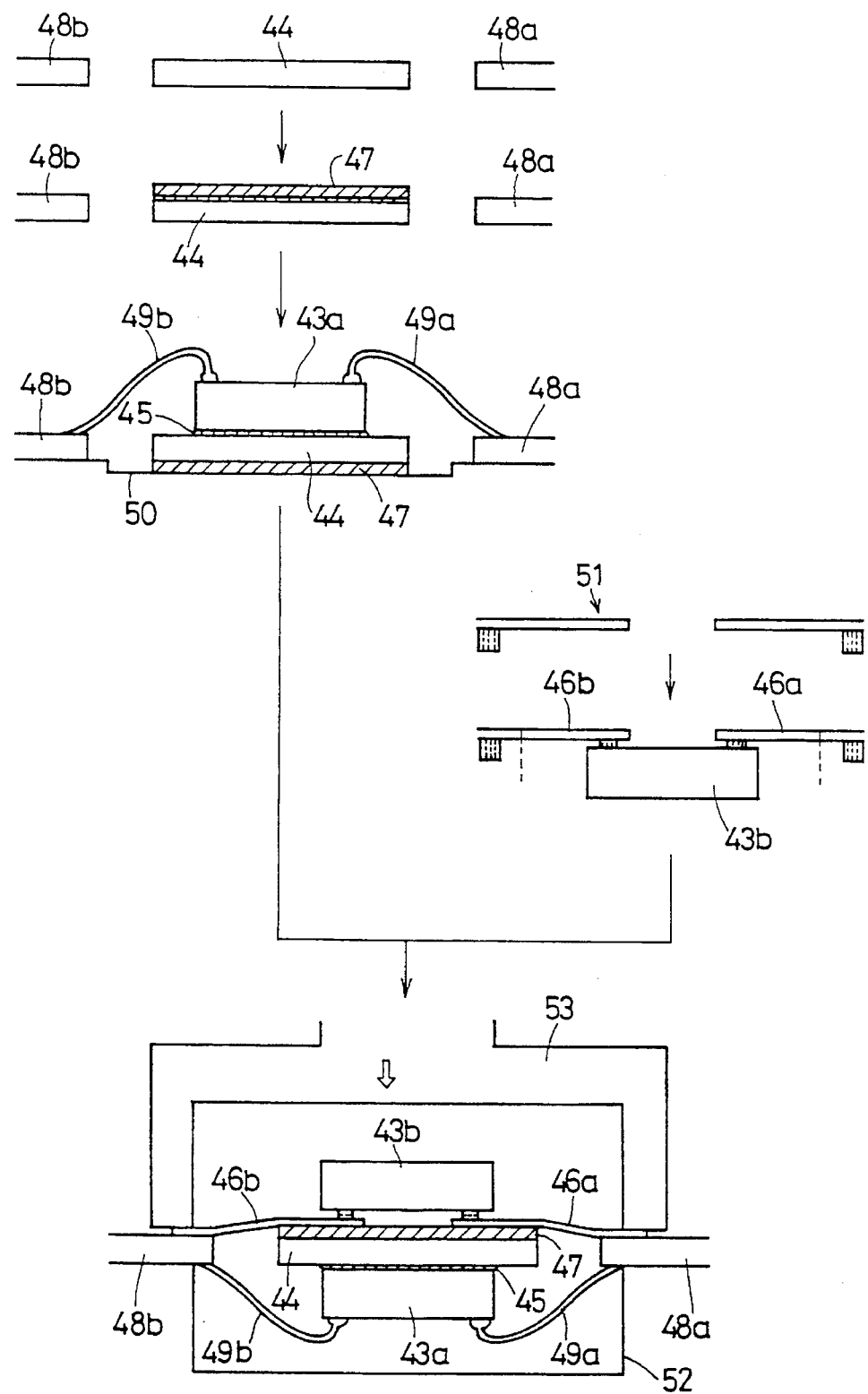
FIG. 9 is an illustration showing a manufacturing process of the semiconductor device of FIG. 8.

After the above processes are completed, the lead frames 48a and 48b are placed on an outer lead bonding table 52 so that the semiconductor chip 43a is placed in a cavity of the outer lead bonding table 52 and the insulating member 47 faces upwardly as shown in FIG. 9. The semiconductor chip 43b is then placed on the insulating member 47 with the TAB leads 46a and 46b positioned between the semiconductor chip 43b and the insulating member 47 and so that the respective end portions of the TAB leads 46a and 46b are positioned on the lead frames 48a and 48b, respectively. The end portions of the TAB leads 46a and 46b are attached to the respective lead frames 48a and 48b by means of outer lead bonding, by pressing the end portions of the TAB leads 46a and 46b using an outer lead bonding tool 53.

It should be noted that if the insulating member 47 is made of a soft material, such as an adhesive, which can be easily deformed, it may be difficult to maintain a sufficient distance between the die stage and the TAB leads 46a and 46b due to the deformation of the insulating member.

Figure 10:
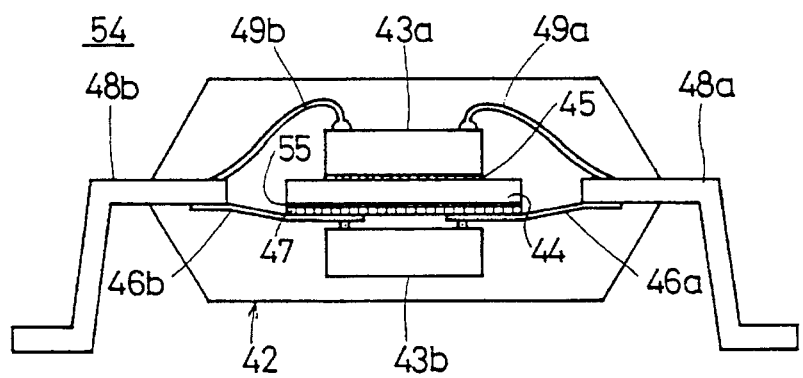
FIG. 10 is a cross sectional view of a variation of the first embodiment shown in FIG. 8.

In order to eliminate the above-mentioned problem, the insulating member 47 may be made of an insulating film and such that the insulating film adheres to the die stage 44 as shown in FIG. 10. FIG. 10 is a cross sectional view of a variation of the first embodiment shown in FIG. 8. In a semiconductor device 54 of FIG. 10, an adhesive 55 is provided between the die stage 44 and the insulating member 47. In such a case shown in FIG. 10, the insulating member 47 is used for providing an insulating function while the adhesive 55 is used for the purpose of adhesion. Accordingly, the insulating member 47 can be made of a material, such as a polyimide film, which can maintain its shape under pressure. Therefore, the above-mentioned problem which may be caused by deformation of the insulating material 47 can be eliminated.

According to the first embodiment and the variation thereof, pressure is applied by the outer lead bonding tool 53 only to the end portions of the TAB leads and corresponding portions of the respective lead frames 48a and 48b. Therefore, there is no damage or deformation to the surface of the semiconductor chip 43a or the bonding wires 49a and 49b.

Additionally, the semiconductor chip 43a is fixed to the die stage 44 with the adhesive 45, and thus the semiconductor chip 43a cannot move due to the flow of the molding resin during the transfer molding process. Further, since there is provided the insulating member 47 between the TAB leads 46a and 46b and the die stage 44, the semiconductor chip 43b can be displaced only a little when a force is applied to the semiconductor chip 43b due to the injection of the molding resin. Therefore, a short circuit caused by the displacement of the semiconductor chips 43a and 43b is prevented.

Figure 11:
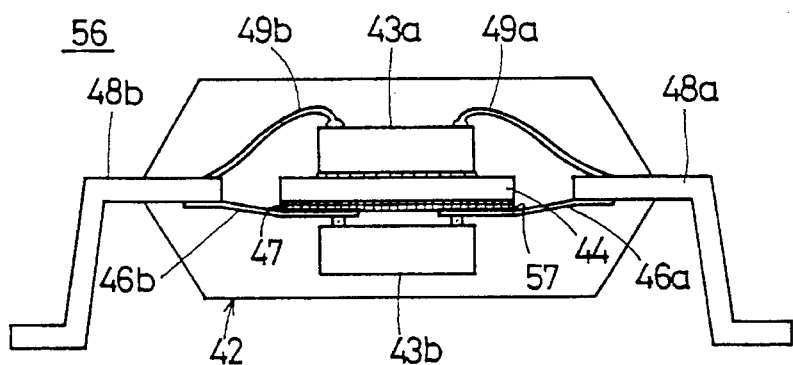
FIG. 11 is a cross sectional view of another variation of the first embodiment shown in FIG. 8.

It should be noted that when placing the TAB leads 46a and 46b on the insulating member 47 to perform the outer lead bonding, an adhesive may be used to fix the TAB leads 46a and 46b to the insulating member 47 as shown in FIG. 11. FIG. 11 is a cross sectional view of another variation of the first embodiment shown in FIG. 8. In a semiconductor device 56 of a variation of the first embodiment, an adhesive 57 is provided between the insulating member 47 and the TAB leads 46a and 46b. By fixing the TAB leads 46a and 46b to the insulating member 47, the semiconductor chip 43b is never displaced during the transfer molding process.

Figure 12A:
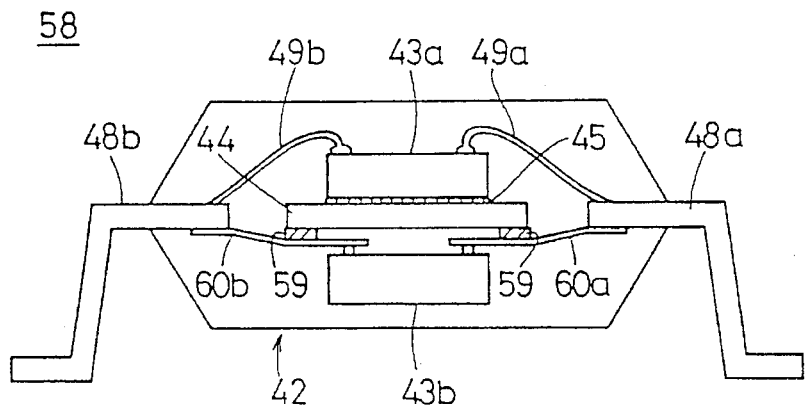
Figure 12B:
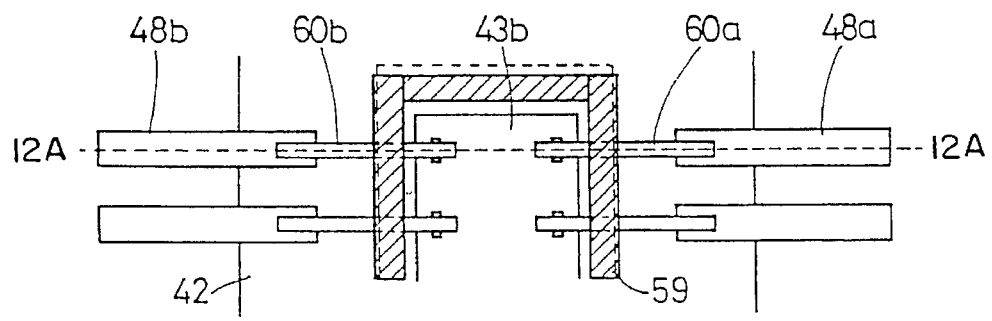

FIGS. 12A and 12B are views showing another variation of the first embodiment shown in FIG. 8 in which FIG. 12A is a cross sectional view taken along a line 12A—12A in FIG. 12A and FIG. 12B is a plan view of a part of the semiconductor device shown in FIG. 12A.

A semiconductor device 58 shown in FIG. 12A has a construction which is the same as that of the semiconductor device 41 shown in FIG. 8 except that the TAB leads 46a and 46b are replaced with TAB leads 60a and 60b. The TAB leads 60a and 60b have polyimide tape portions 59 thereon.

A description will now be given, with reference to FIG. 13, of a manufacturing process of the semiconductor device

58. First, the die stage 44 is placed on a die table 50, and the semiconductor chip 43*a* is mounted on the surface of the die stage 44 with an adhesive 45. After that, the semiconductor chip 43*a* is connected to the lead frames 48*a* and 48*b* with the bonding wires 49*a* and 49*b*.

In a separate process, the semiconductor chip 43*b* is attached to a TAB tape 61 by means of inner lead bonding. Unnecessary portions of the TAB tape 61 are then cut off at positions indicated by dotted lines in FIG. 13 so as to form the TAB leads 60*a* and 60*b*. The cut-off is performed so that TAB tape (polyimide tape) portions 59 remain on the TAB leads 60*a* and 60*b*.

Figure 13:
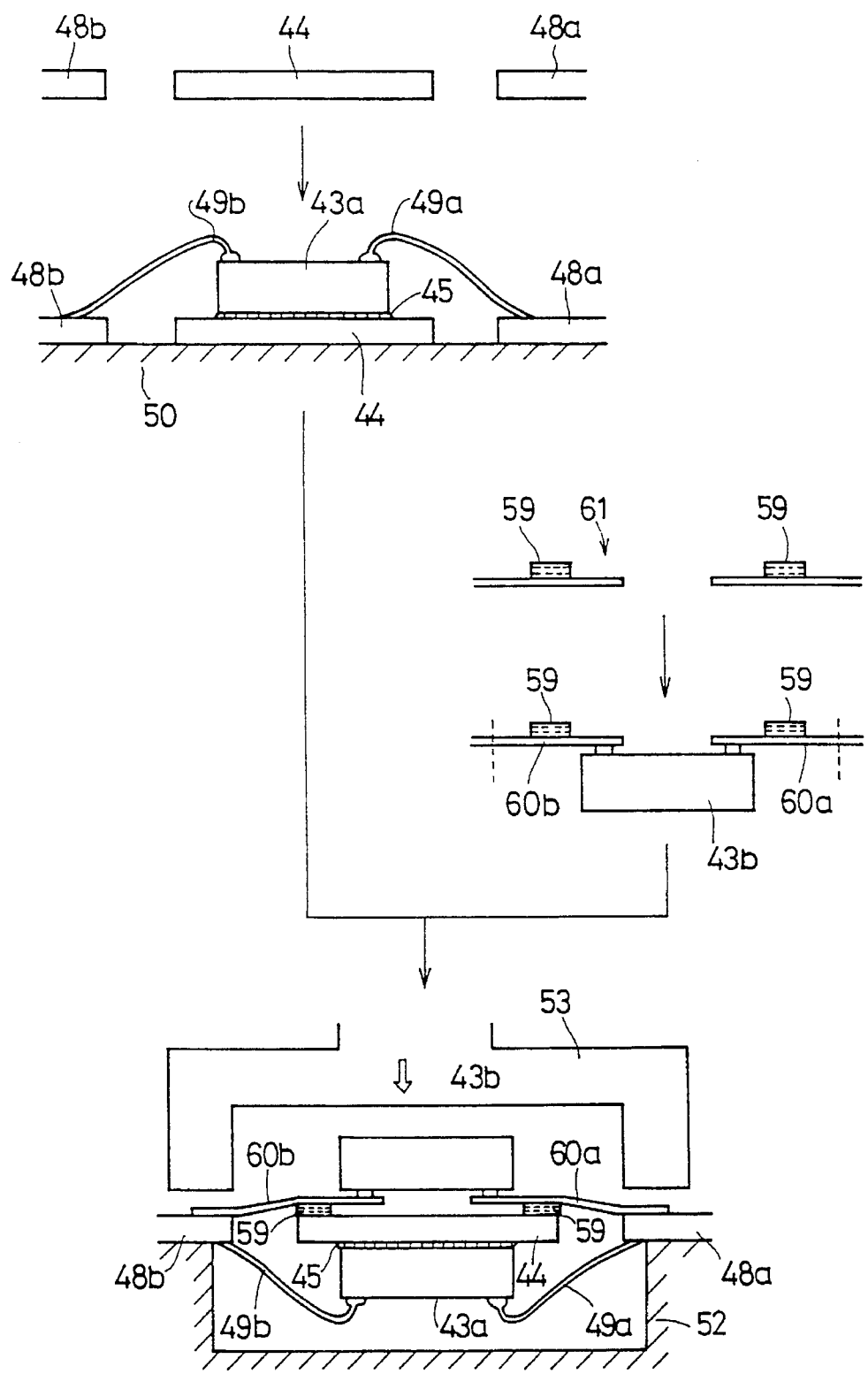
FIG. 13 is an illustration showing a manufacturing process of the semiconductor device of FIG. 12A.

After the above processes are completed, the lead frames 48*a* and 48*b* are placed on an outer lead bonding table 52 so that the semiconductor chip 43*a* is placed in a cavity of the outer lead bonding table 52 as shown in FIG. 13. The semiconductor chip 43*b* is then placed on the die stage 44 with the TAB leads 60*a* and 60*b* positioned between the semiconductor chip 43*b* and the die stage 44 so that the end portion of each of the TAB leads 60*a* and 60*b* is positioned on the lead frames 48*a* and 48*b*, respectively. The end portions of the TAB leads 60*a* and 60*b* are attached to the respective lead frames 48*a* and 48*b* by means of outer lead bonding by pressing the end portions of the TAB leads 46*a* and 46*b* using an outer lead bonding tool 53. Since the remaining polyimide tape portions 59 are positioned between the die stage 44 and each of the TAB leads 60*a* and 60*b*, the polyimide tape portions 59 act as the insulating member 47 of the first embodiment. Accordingly, in this variation, preparation of the independent insulating member can be omitted.

Figure 14:
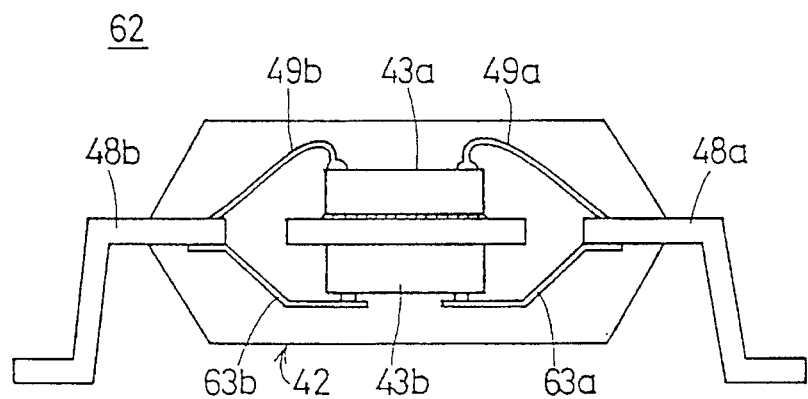
FIG. 14 is a cross sectional view of another variation of the first embodiment shown in FIG. 8.

FIG. 14 is a cross sectional view of another variation of the first embodiment shown in FIG. 8. In a semiconductor device 62 shown in FIG. 14, the semiconductor chip 43*b* is positioned upside down relatively to the semiconductor chip 43*a*. That is, the surface of the semiconductor chip 43*b*, on which surface circuitry is provided, faces downwardly, and TAB leads 63*a* and 63*b* are connected to the semiconductor chip 43*b* by means of inner lead bonding.

It should be noted that in the above-mentioned first embodiment and variations thereof, if the transfer molding is performed without connecting the semiconductor chip 43*b* to the lead frames 48*a* and 48*b* by means of outer lead bonding, a construction the same as a semiconductor device having a single semiconductor chip, that is the semiconductor chip 43*a*, can be obtained. Accordingly, there is an advantage in that lead frames common to various types of semiconductor device can be used, and thus the semiconductor device is manufactured at a reduced cost.

Figure 15A:
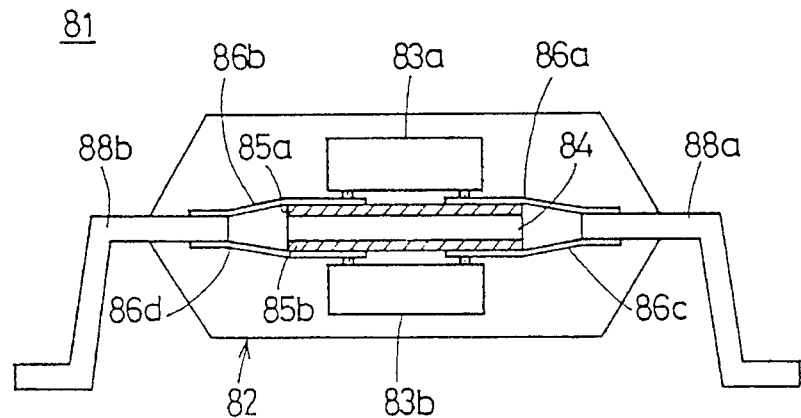
Figure 15B:
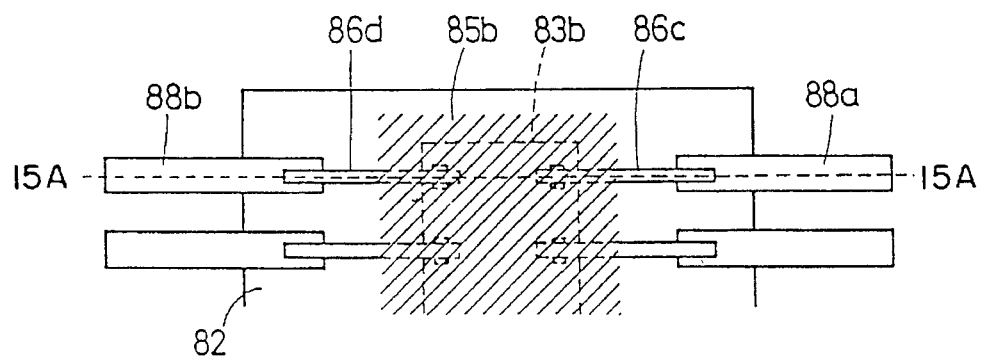

A description will now be given, with reference to FIGS. 15A and 15B, of a second embodiment of a semiconductor device according to the present invention. FIGS. 15A and 15B are views showing a second embodiment of a semiconductor device according to the present invention in which FIG. 15A is a cross sectional view taken along a line 15A—15A in FIG. 15B and FIG. 15B is a plan view of a part of the semiconductor device shown in FIG. 15A.

A semiconductor device 81 shown in FIG. 15A comprises two semiconductor chips 83*a* and 83*b* within a single package 82. The semiconductor chip 83*a* is positioned on an upper surface of a die stage 84 with an insulating member 85*a* positioned between the die stage 84 and TAB leads 86*a* and 86*b*. The surface on which circuitry is provided faces downwardly. One end of each of the TAB leads 86*a* and 86*b* is connected to the semiconductor chip 88*a* by means of inner lead bonding, and the other end is connected to the lead frames 88*a* and 88*b* so that the semiconductor chip 83*a* can be electrically connected to external devices.

The semiconductor chip 83*b* is positioned under the die stage 84 with an insulating member 85*b* positioned between the die stage 84 and TAB leads 86*c* and 86*d*. The surface on which circuitry is provided faces upwardly. An insulating member 85*b* is provided between the semiconductor 83*b* and the die stage 84. One end of each of the TAB leads 86*c* and 86*d* is connected to the semiconductor chip 88*b* by means of inner lead bonding, and the other end is connected to the lead frames 88*a* and 88*b* so that the semiconductor chip 83*b* can be electrically connected to external devices.

In the present embodiment, the die stage 84, provided with insulating members 85*a* and 85*b* on the opposite surfaces thereof is positioned in a space between the semiconductor chip 83*a* and 83*b*. That is, the semiconductor chips 83*a* and 83*b* cannot move in the direction toward each other. Therefore, only a slight displacement of the semiconductor chips 83*a* and 83*b* may occur during the transfer molding, and thus the aforementioned short circuit can be eliminated. It should be noted that instead of using the insulating members 85*a* and 85*b*, the TAB leads 86*a*, 86*b*, 86*c* and 86*d* may be attached to the die stage 84 with an insulating adhesive.

Figure 16:
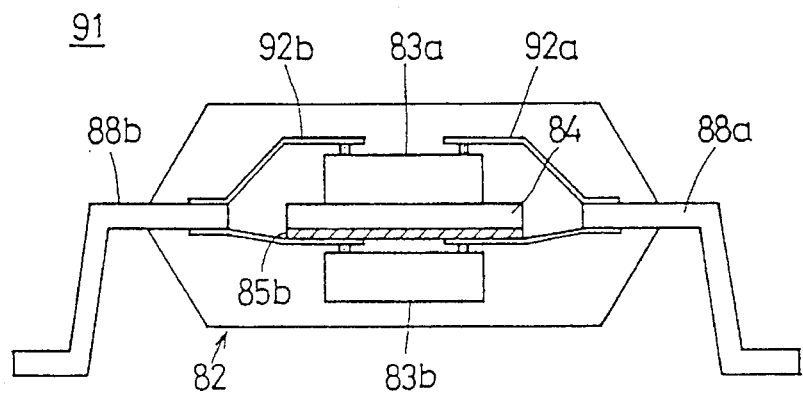
FIG. 16 is a cross sectional view of a variation of the second embodiment shown in FIG. 15A.

FIG. 16 is a cross sectional view of a variation of the second embodiment shown in FIG. 15A. In a semiconductor device 91 shown in FIG. 16, the semiconductor chip 83*a* is positioned on the die stage 84 with the surface on which circuitry is provided facing upwardly. First ends of TAB leads 92*a* and 92*b*, which are bent as shown in FIG. 16, are attached to the semiconductor chip 83*a* by means of inner lead bonding, and the other ends thereof are connected to the respective lead frames 88*a* and 88*b*. The semiconductor chip 83*b* is provided similarly to the second embodiment mentioned above.

Figure 17A:
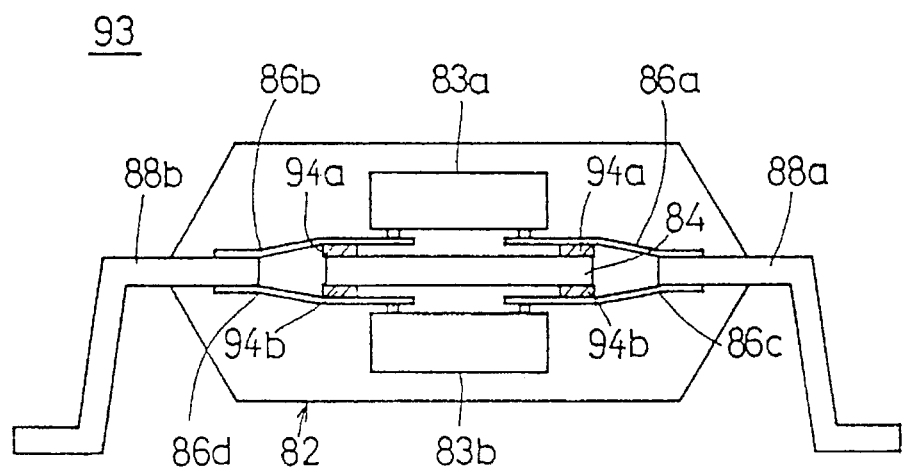
Figure 17B:
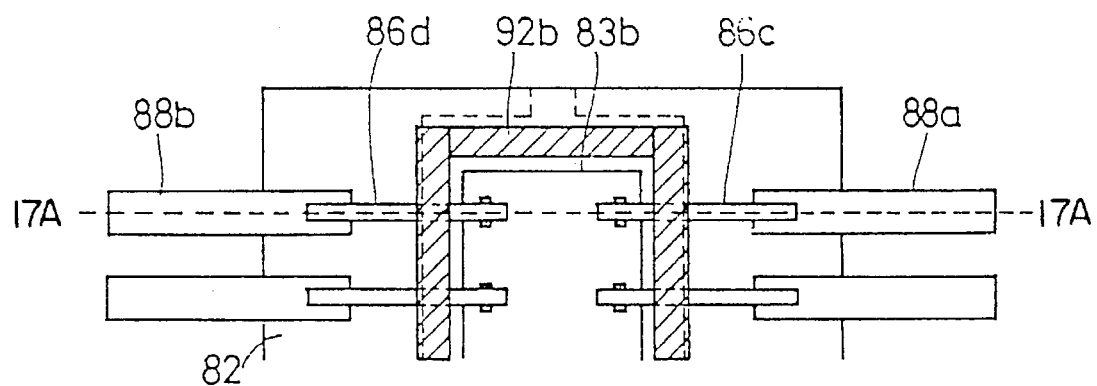

FIGS. 17A and 17B are views showing another variation of the second embodiment shown in FIG. 15A in which FIG. 17A is a cross sectional view taken along a line 17A—17A in FIG. 17B and FIG. 17B is a plan view of a part of the semiconductor device shown in FIG. 17A.

A semiconductor device 93 shown in FIG. 17A has a construction the same as that of the semiconductor device 81 shown in FIG. 15A except that insulating members 94*a* and 94*b* are provided for the respective TAB leads 86*a*, 86*b*, 86*c* and 86*d* instead of providing the insulating members 85*a* and 85*b*. The insulating members 94*a* and 94*b*, which are portions of remaining TAB tape (polyimide tape), are formed on the respective TAB leads 86*a*, 86*b*, 86*c* and 86*d* when mounting the semiconductor chips 83*a* and 83*b* to a TAB tape.

Figure 18A:
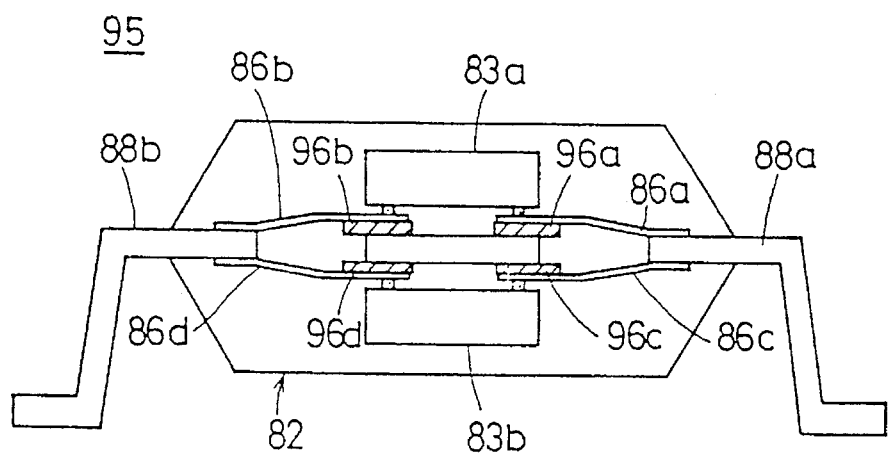
Figure 18B:
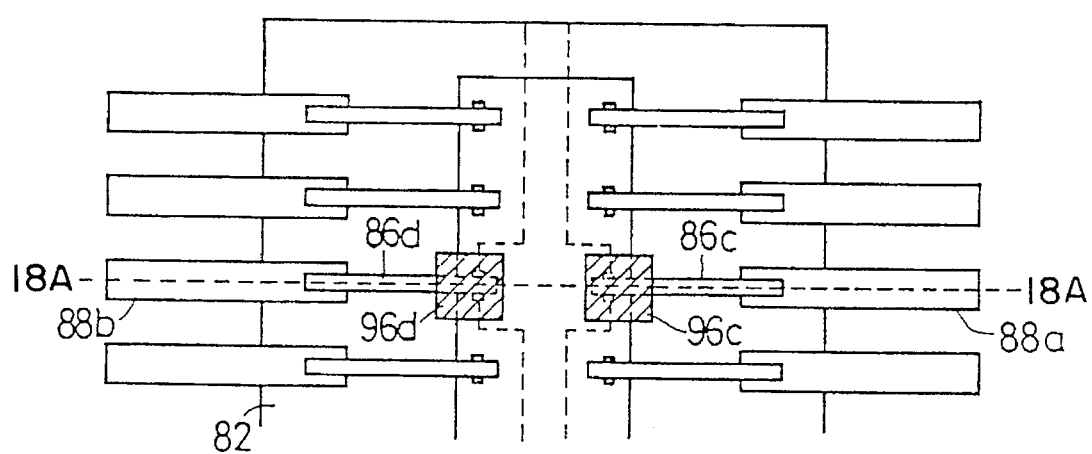

FIGS. 18A and 18B are views showing another variation of the second embodiment shown in FIG. 15A in which FIG. 18A is a cross sectional view taken along a line 18A—18A in FIG. 18B and FIG. 18B is a plan view of a part of the semiconductor device shown in FIG. 18A. In a semiconductor device 95 shown in FIG. 18A, the insulating members 94*a* and 94*b* of the above-mentioned variation are replaced with insulating members 96*a*, 96*b*, 96*c* and 96*d* each formed as a small strip. The single strip insulating members 96*a*, 96*b*, 96*c* and 96*d* are formed on the respective TAB leads 86*a*, 86*b*, 86*c* and 86*d*. Although FIG. 18B shows that the insulating members are provided only for the TAB leads 86*c* and 86*d*, the insulating members are provided for all such TAB leads of the semiconductor device 95.

It should be noted that in the above-mentioned second embodiment and variations thereof, there is an advantage in that the same lead frame, as that of a semiconductor device having a single semiconductor chip, can be used and thus the semiconductor device may be manufactured at a reduced cost.

Figure 19A:
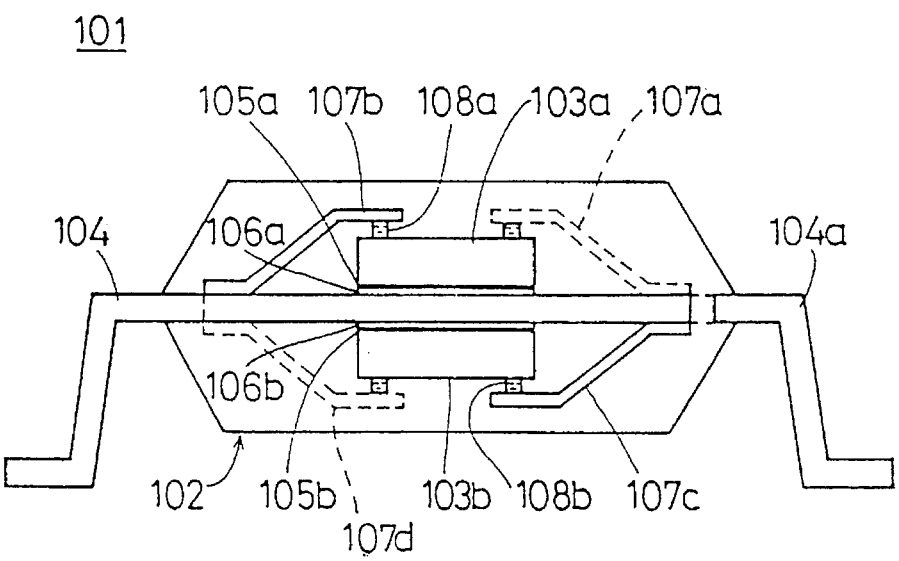
Figure 19B:
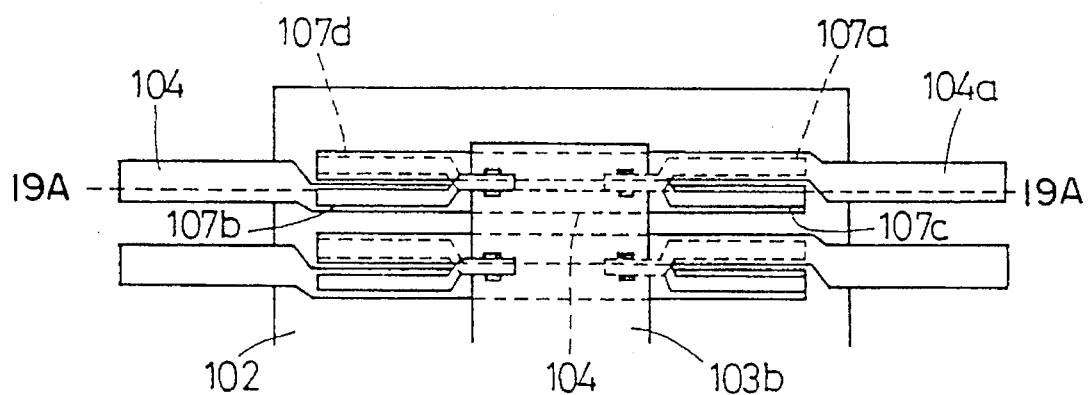

A description will now be given, with reference to FIGS. 19A and 19B, of a third embodiment of a semiconductor device according to the present invention. FIGS. 19A and 19B are views showing the third embodiment of a semiconductor device according to the present invention in which FIG. 19A is a cross sectional view taken along a line 19A—19A in FIG. 19B and FIG. 15B is a plan view of a part of the semiconductor device shown in FIG. 19A.

A semiconductor chip 101 shown in FIG. 19A is a chip-on-chip type as shown in FIG. 19A, and comprises two semiconductor chips 103a and 103b within a single package. A lead frame 104, positioned between the semiconductor chips 103a and 103b, extends to the right side of the semiconductor chip 103a in the figure. An insulating member 105a, for example a polyimide tape, is attached to the top surface of the lead frame 104 with an adhesive 106a. The semiconductor chip 103a is placed on the insulating member 105a with the surface on which circuitry is provided facing upwardly. TAB leads 107a and 107b are attached to the semiconductor chip 103a by means of inner lead bonding.

The TAB lead 107b is connected to a portion of the lead frame 104, which portion is located on the left side of the semiconductor chip 103a, by means of outer lead bonding. The TAB lead 107a is connected to a portion of a lead frame 104a, which portion is located on the right side of the semiconductor chip 103a, by means of outer lead bonding. The lead frame 104a also passes through the space, between the semiconductor chip 103a and semiconductor chip 103b, and extends to the left side of the semiconductor chip 103a. Accordingly, the semiconductor chip 103a can be electrically connected to external devices via the TAB leads 107a and 107b.

An insulating member 105b, for example a polyimide tape, is attached to a bottom surface of the lead frame 104 with an adhesive 106a. The semiconductor chip 103b is placed on the insulating member 105a with the surface on which circuitry is provided facing downward. TAB leads 107c and 107d are attached to the semiconductor chip 103b by means of inner lead bonding.

The TAB lead 107d is connected to a portion of the lead frame 104, which portion is located on the left side of the semiconductor chip 103b, by means of outer lead bonding. The TAB lead 107c is connected to a portion of a lead frame 104a, which portion is located on the right side of the semiconductor chip 103b by means of outer lead bonding. The lead frame 104a also passes through the space, between the semiconductor chip 103a and semiconductor chip 103b, and extends to the left side of the semiconductor chip 103a. Accordingly, the semiconductor chip 103b can be electrically connected to external devices via the TAB leads 107c and 107d.

In order to achieve the above-mentioned construction, the lead frames 104 and 104a are formed so that the lead frames 104 and 104a do not make contact with each other as shown in FIG. 19B. The TAB leads 107a, 107b, 107c and 107d are also formed so that they correspond to the respective lead frames 104 and 104a as shown in FIG. 19B. Accordingly, the TAB lead 107c attached to a pad 108b of the semiconductor chip 103b, which pad has the same function as the pad 108a of the semiconductor chip 103a, is connected to the lead frame 104 to which the TAB lead 107b attached to the pad 108a is connected. Therefore, unlike the aforementioned conventional semiconductor device, the semiconductor chips 103a and 103b do not need to be in a mirror symmetry relationship, and thus identical semiconductor chips can be provided in a single package.

Figure 20:
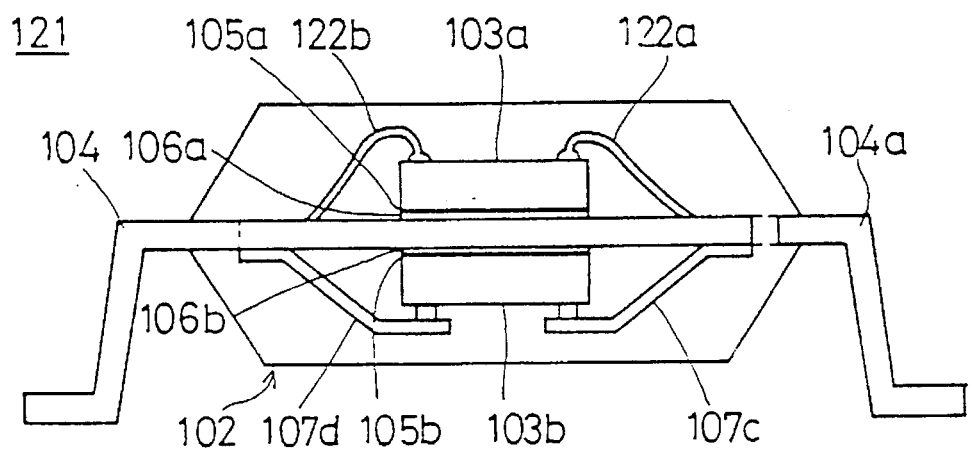
FIG. 20 is a cross sectional view of a variation of the third embodiment shown in FIG. 19A.

FIG. 20 is a cross sectional view of a variation of the third embodiment shown in FIG. 19A. In a semiconductor device 121 shown in FIG. 20, the TAB leads 107a and 107b of the semiconductor device 101 shown in FIG. 19A are replaced with bonding wires 122a and 122b, respectively. Accordingly, the present variation can be formed using only a single TAB tape, and thus a reduction in manufacturing cost can be obtained.

Figure 21:
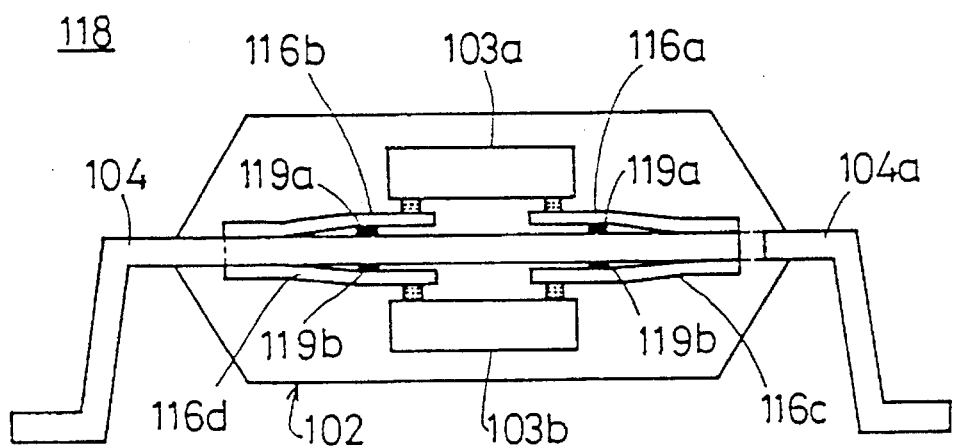
FIG. 21 is a cross sectional view of another variation of the third embodiment shown in FIG. 19A.

FIG. 21 is a cross sectional view of another variation of the third embodiment shown in FIG. 19A. In a semiconductor device 118 shown in FIG. 21, the semiconductor chip 103a is positioned with the surface on which circuitry is provided facing downwardly, and the semiconductor chip 103b is positioned with the surface on which circuitry is provided facing upwardly. The semiconductor chips 103a and 103b are connected to the lead frames 104 and 104a via TAB leads 116a, 116b, 116c and 116d, respectively. On the TAB leads 116a, 116b, 116c and 116d, there are provided TAB tape portions 119a, 119b, 119c and 119d, respectively, so that the TAB tape portions 119a, 119b, 119c and 119d are positioned between the lead frames 104 and 104a and the respective TAB leads 116a, 116b, 116c and 116d. The TAB tape portions 119a, 119b, 119c and 119d are formed, as described for the variation of the first embodiment with reference to FIG. 13, when forming the TAB leads 116a, 116b, 116c and 116d.

Figure 22A:
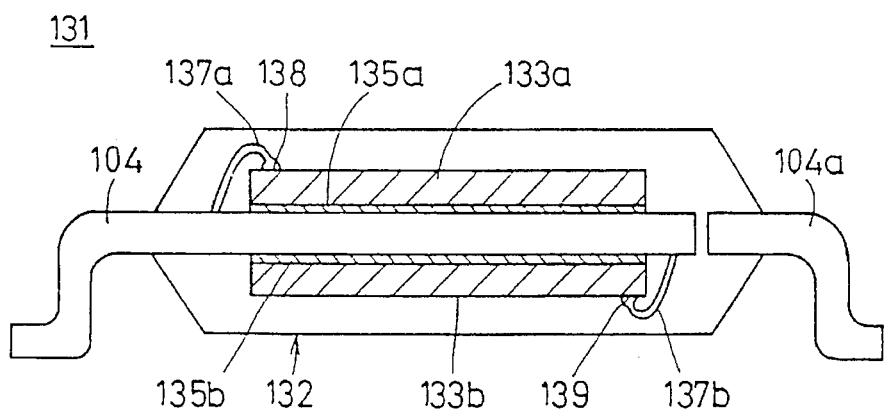
FIGS. 22A and 22B are views showing another variation of the third embodiment shown in FIG. 19A in which FIG.
Figure 22B:
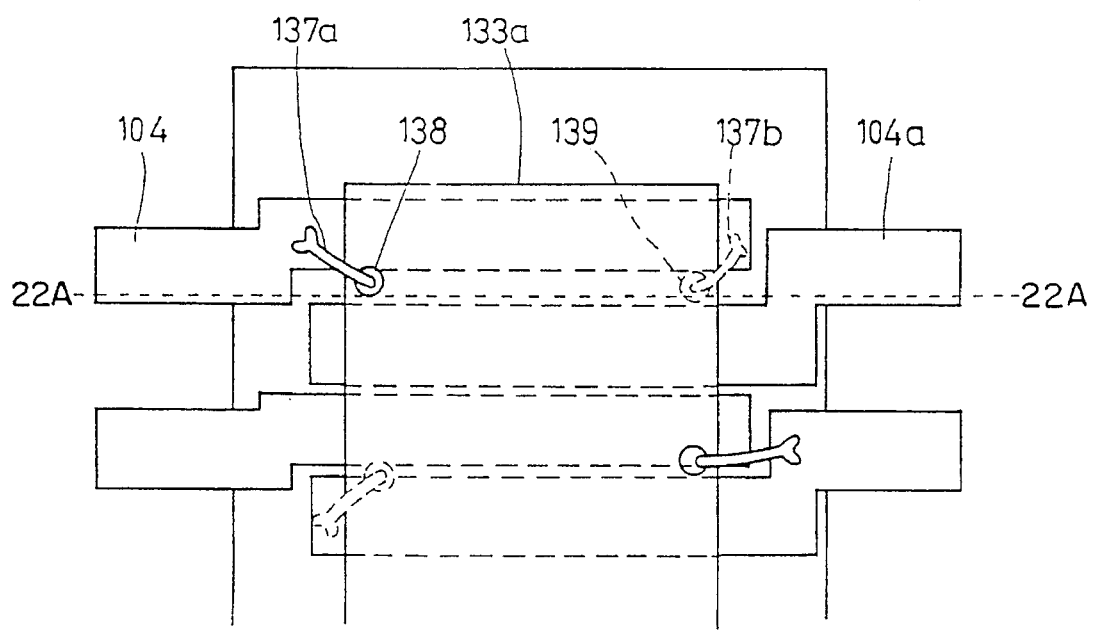

FIGS. 22A and 22B are views showing another variation of the third embodiment shown in FIG. 19A in which FIG. 22A is a cross sectional view taken along a line 22A—22A in FIG. 22B; FIG. 22B is a plan view of a part of the semiconductor device shown in FIG. 22A.

In a semiconductor device 131 shown in FIG. 22A, semiconductor chips 133a and 133b are provided instead of the semiconductor chips 103a and 103b of the semiconductor device 101 shown in FIG. 19A. The semiconductor chips 133a and 133b are connected to the lead frames 104 and 104a via bonding wires 137a and 137b. First ends of the bonding wires 137a and 137b is attached to the respective pads 138a and 138b by means of wire bonding, and second ends thereof are connected to the same lead frame 104, as shown in FIG. 22B. An insulating member 135a, made of a material such as polyimide resin or SiN, is provided between the semiconductor chip 133a and the lead frames 104 and 104a. Similarly, an insulating member 135b, made of a material such as polyimide resin or SiN, is provided between the semiconductor chip 133b and the lead frames 104 and 104a.

In the present embodiment and the variations thereof, the lead frames 104 and 104a are positioned in a space between the semiconductor chip 103a and 103b or between the semiconductor chips 133a and 133b. That is, the semiconductor chips 103a and 103b or the semiconductor chips 133a and 133b cannot move toward each other. Therefore, only a slight displacement of the semiconductor chips 103a and 103b or the semiconductor chips 133a and 133b may occur during the transfer molding, and thus the aforementioned short circuit can be eliminated.

Figure 23A:
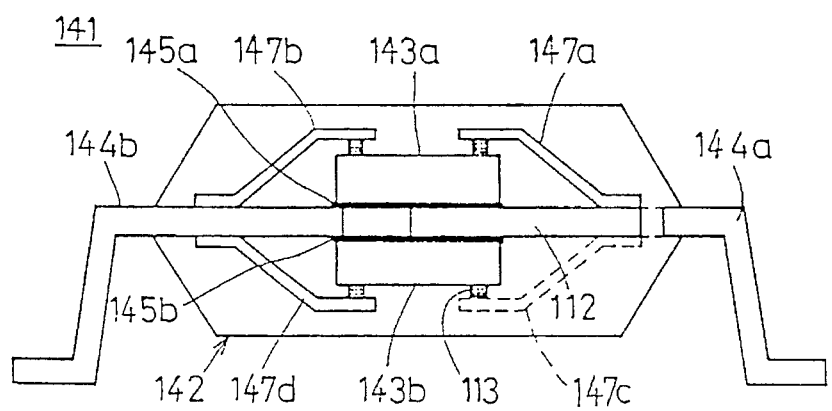
Figure 23B:
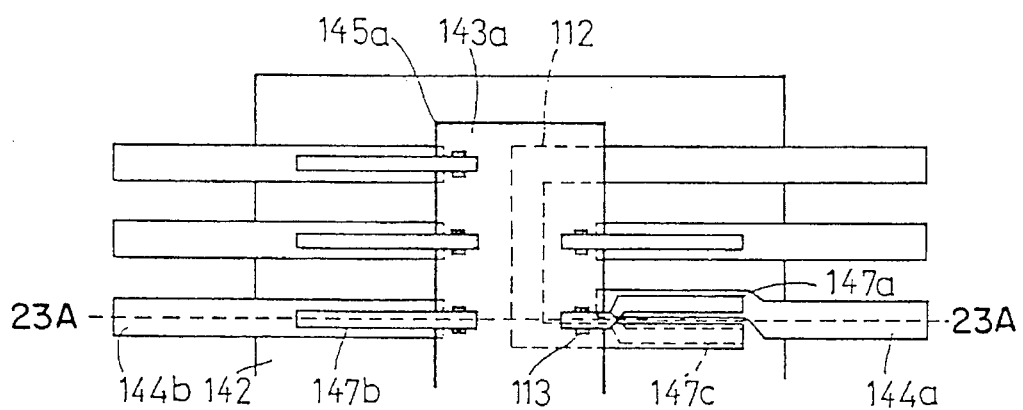

A description will now be given, with reference to FIG. 23A and 23B, of a fourth embodiment of a semiconductor device according to the present invention. FIGS. 23A and 23B are views showing the fourth embodiment of a semiconductor device according to the present invention in which FIG. 23A is a cross sectional view taken along a line 23A—23A in FIG. 23B and FIG. 23B is a plan view of a part of the semiconductor device shown in FIG. 23A.

In a semiconductor device 141 shown in FIG. 23A, semiconductor chips 143a and 143b are provided in a single package 142. The semiconductor chip 143a is positioned with the surface on which circuitry is provided facing directed upwardly. The semiconductor chip 143b is positioned with the surface on which circuitry is provided facing downwardly. Lead frames 144a and 144b extends into a space formed between the semiconductor chips 143a and 143b. A lead frame 112 is formed in a channel shape as shown in FIG. 23B, and runs through the space between the semiconductor chips 143a and 143b.

TAB leads 147a and 147b are attached to the semiconductor chip 143a by means of inner lead bonding. TAB leads 147c and 147d are attached to the semiconductor chip 143b by means of inner lead bonding. The TAB leads 147a, 147b, 147c and 147d are connected to the respective lead frames 144a, 144b and 112. As shown in FIG. 23B, the TAB lead 147a is formed so that the TAB leads can be connected to the lead frame 144a, and the TAB lead 147c is formed so that the TAB lead 147c can be connected to the lead frame 112. An insulating member 145a is positioned between the semiconductor device 143a and the lead frames 144a, 144b and 112. An insulating member 146a is positioned between the semiconductor device 143b and the lead frames 144a, 144b and 112.

According to the above-mentioned construction of the semiconductor device 141, an end of the lead frame 112, which end extends outside a package 142, can be positioned in a desired position. Therefore, there is no restriction on positioning of the chip selector pad 113 of the semiconductor chip 143b.

Figure 24A:
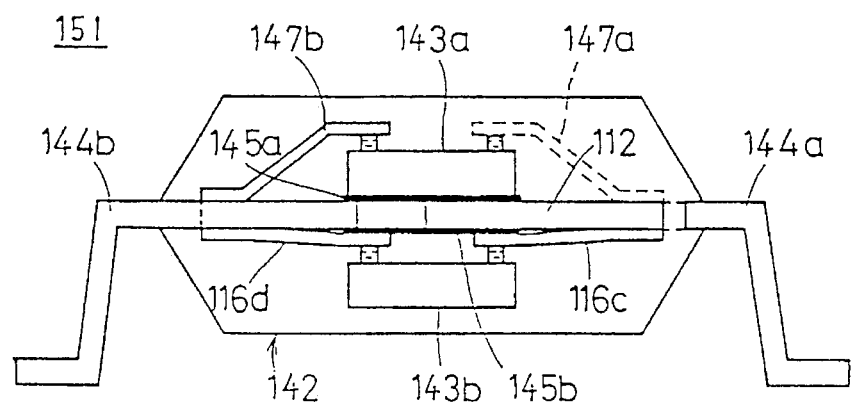
Figure 24B:
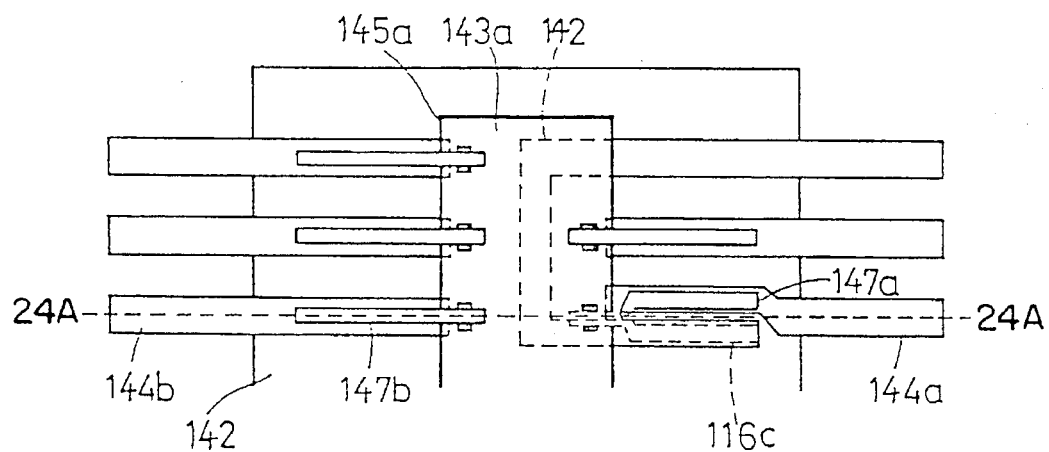

FIGS. 24A and 24B are views showing a variation of the fourth embodiment shown in FIG. 23A in which FIG. 24A is a cross sectional view taken along a line 24A—24A in FIG. 24B; FIG. 24B is a plan view of a part of the semiconductor device shown in FIG. 24A. In a semiconductor device 151 shown in FIG. 24A, the semiconductor chip 143a is positioned with the surface on which circuitry is provided facing upward, which condition is the same as the semiconductor chip 143a. Accordingly, TAB leads 116a and 116b are provided instead of the TAB leads 147c and 147d.

In the present embodiment and the variations thereof, the lead frames 144a, 144b and 112 are positioned in a space between the semiconductor chips 143a and 143b. That is, the semiconductor chips 143a and 143b cannot move toward each other. Therefore, only a slight displacement of the semiconductor chips 143a and 143b may occur during the transfer molding, and thus the aforementioned short circuit can be eliminated.

It should be noted that although the embodiments and variations thereof are described as a semiconductor device having a pair of semiconductor chips, a plurality of pairs of semiconductor chips can be provided in a single package.

The invention is not limited to the specifically disclosed embodiments, and variations and modifications may be made without departing from the scope of the present invention.

What is claimed is:

1. A semiconductor device comprising:

a package having at least a first semiconductor chip and a second semiconductor chip, said first semiconductor chip being positioned above said second semiconductor chip;

at least a first lead frame and a second lead frame provided between said first and second semiconductor chips, and extending from said package so that said first semiconductor chip and said second semiconductor chip can be electrically connected to external devices, said first lead frame extending from a first side of said first and second semiconductor chips to a second side opposite to said first side of said first and second semiconductor chips, said second lead frame extending from said second side to said first side;

first connecting means for connecting first semiconductor chip to said first and second lead frames; and second connecting means for connecting said second semiconductor chip to said first and second lead frames, wherein said first connecting means comprises a first TAB lead and said second connecting means comprises a second TAB lead, and wherein said first semiconductor chip is positioned so that a surface on which circuitry is provided faces downwardly, a first insulating member being provided between said first TAB lead and said first and second lead frames, and said second semiconductor chip is positioned so that a surface on which circuitry is provided faces upwardly, a second insulating member being provided between said second TAB lead and said first and second lead frames.

2. The semiconductor device as claimed in claim 1, wherein said first insulating member is formed of a portion of a TAB tape used for forming said first TAB tape, and said second insulating member is formed of a portion of a TAB tape used for forming said second TAB lead.

3. A semiconductor device comprising:

a package having at least a first semiconductor chip and a second semiconductor chip, said first semiconductor chip being positioned above said second semiconductor chip;

at least a first lead frame, a second lead frame and a third lead frame being provided between said first and second semiconductor chips, and extending from said package so that said first semiconductor chip and said second semiconductor chip can be electrically connected to external devices, said first lead frame extending a predetermined length from a first side of said first and second semiconductor chips, said second lead frame extending from a second side opposite to said first side of said first and second semiconductor chips, a space being formed between an end of said first lead frame and an end of said second lead frame and between said first semiconductor chip and said second semiconductor chip, said third lead frame having a portion extending in said space in a direction perpendicular to the longitudinal direction of said first and second lead frames;

at least one first TAB lead connecting said first semiconductor chip to a corresponding one of said first and third lead frames; and at least one second TAB lead connecting said second semiconductor chip to a corresponding one of said second and third lead frames.

4. The semiconductor device as claimed in claim 3, wherein said first semiconductor chip is positioned so that a surface on which circuitry is provided faces upward, a first insulating member being provided between said first semiconductor chip and said first, second and third lead frames, and said second semiconductor chip is positioned so that a surface on which circuitry is provided faces downward, a second insulating member being provided between said second semiconductor chip and said first, second and third lead frames.

5. The semiconductor device as claimed in claim 3, wherein said first semiconductor chip is positioned so that a surface on which circuitry is provided faces upward, a first insulating member being provided between said first semiconductor chip and said first, second and third lead frames, and said second semiconductor chip is positioned so that a surface on which circuitry is provided faces upward, a second insulating member being provided between said second TAB lead and said first, second and third lead frames.

6. A semiconductor device comprising:

a package having at least a first semiconductor chip and a second semiconductor chip, said first semiconductor chip being positioned above said second semiconductor chip;

at least a first lead frame and a second lead frame provided between said first and second semiconductor chips, and extending from said package so that said first semiconductor chip and said second semiconductor chip can be electrically connected to external devices, said first lead frame extending from a first side of said first and second semiconductor chips to a second side opposite to said first side of said first and second semiconductor chips, said second lead frame extending from said second side to said first side;

first connecting means for connecting said first semiconductor chip to said first and second lead frames; and second connecting means for connecting said second semiconductor chip to said first and second lead frames, wherein:

said first semiconductor chip is positioned so that a surface on which circuitry is provided faces upwardly, a first insulating member being provided between said first semiconductor chip and said first and second lead frames, said second semiconductor chip is positioned so that a surface on which circuitry is provided faces downwardly, a second insulating member being provided between said second semiconductor chip and said first and second lead frames, and each of said first and second connecting means comprises a TAB lead.

7. A semiconductor device comprising:

a package having at least a first semiconductor chip and a second semiconductor chip, said first semiconductor chip being positioned above said second semiconductor chip;

at least a first lead frame and a second lead frame provided between said first and second semiconductor chips, and extending from said package so that said first semiconductor chip and said second semiconductor chip can be electrically connected to external devices, said first lead frame extending from a first side of said first and second semiconductor chips to a second side opposite to said first side of said first and second semiconductor chips, said second lead frame extending from said second side to said first side;

first connecting means for connecting said first semiconductor chip to said first and second lead frames; and second connecting means for connecting said second semiconductor chip to said first and second lead frames, wherein:

said first semiconductor chip is positioned so that a surface on which circuitry is provided faces upwardly, a first insulating member being provided between said first semiconductor chip and said first and second lead frames, said second semiconductor chip is positioned so that a surface on which circuitry is provided faces downwardly, a second insulating member being provided between said second semiconductor chip and said first and second lead frames, and said first connecting means comprises a bonding wire and said second connecting means comprises a TAB lead.

* * * * *

UNITED STATES PATENT AND TRADEMARK OFFICE
CERTIFICATE OF CORRECTION

PATENT NO. : 5,579,208          Page 1 of 2

DATED : Nov. 26, 1996

INVENTOR(S) : HONDA et al.

It is certified that error appears in the above-indentified patent and that said Letters Patent is hereby corrected as shown below:

Col. 1,  line 35, after "16a and" insert --16b by--;
     line 44, after "The" insert --respective--.

Col. 3,  line 46, change "common as well" to --common, as well,--.

Col. 4,  line 30, after "process" insert --,--.

Col. 6,  line 39, after "invention" insert --,--;
     line 51, after "FIG. 15A" insert --,--;
     line 57, after "invention" insert --,--;
     line 67, after "FIG. 19A" insert --,--.

Col. 7,  line 6, after "invention" insert --,--;
     line 11, after "FIG. 23A" insert --,--.

Col. 8,  line 56, after "FIG. 8" insert --,--.

Col. 10, line 15, after "thereof" insert --,--;
     line 37, after "FIG. 15A" insert --,--;
     line 53, after "FIG. 15A" insert --,--;
     line 59, after "96d" insert --,--.

Col. 11, line 9, after "invention" insert --,--.

Col. 12, line 32, after "FIG. 19A" inert --,--;
     line 43, change "is" to --are--;
     line 67, after "invention" insert --,--.

UNITED STATES PATENT AND TRADEMARK OFFICE
CERTIFICATE OF CORRECTION

PATENT NO. : 5,579,208
DATED : Nov. 26, 1996
INVENTOR(S) : HONDA et al.

Page 2 of 2

It is certified that error appears in the above-indentified patent and that said Letters Patent is hereby corrected as shown below:

Col. 13, line 35, after "FIG. 23A" insert --,--;

Signed and Sealed this

Twenty-second Day of April, 1997

Attest:

BRUCE LEHMAN

Attesting Officer

Commissioner of Patents and Trademarks